(12) United States Patent
Doudin

(10) Patent No.: US 7,358,846 B2
(45) Date of Patent: Apr. 15, 2008

(54) MAGNETIC SPIN VALVE WITH A MAGNETOELECTRIC ELEMENT

(76) Inventor: Bernard Doudin, Cindy Dr., Lincoln, NE (US) 68512

( * ) Notice: Subject to any disclaimer, the term of this patent is extended or adjusted under 35 U.S.C. 154(b) by 108 days.

(21) Appl. No.: 11/444,675

(22) Filed: Jun. 1, 2006

(65) Prior Publication Data

US 2007/0014143 A1    Jan. 18, 2007

Related U.S. Application Data

(60) Provisional application No. 60/686,356, filed on Jun. 1, 2005.

(51) Int. Cl.
    *H01L 43/00* (2006.01)
(52) U.S. Cl. ............ 338/32 R; 338/32 H; 360/324.12; 324/207.22

(58) Field of Classification Search ............. 338/32 R, 338/32 H, 320; 360/324.11, 324.12, 322; 365/117, 145, 158; 324/207.22, 207.25, 324/207.13

See application file for complete search history.

(56) References Cited

U.S. PATENT DOCUMENTS

| | | | | |
|---|---|---|---|---|
| 4,401,966 | A | * | 8/1983 | Ohmura et al. ............ 338/32 R |
| 5,574,364 | A | * | 11/1996 | Kajimoto et al. ........ 324/207.12 |
| 5,738,938 | A | * | 4/1998 | Kawano et al. ............. 428/332 |
| 6,476,601 | B2 | * | 11/2002 | Zharski et al. ......... 324/207.22 |

* cited by examiner

*Primary Examiner*—K. Richard Lee
(74) *Attorney, Agent, or Firm*—Shook, Hardy & Bacon LLP

(57) ABSTRACT

The present invention provides systems and method utilizing magnetoelectric materials such as $Cr_2O_3$ to construct tunneling magnetoresistence and/or giant magnetoresistence structures for memory and/or logical circuitry. An applied voltage differential induces a magnetic moment in the magnetoelectric material, which in turn tunes an exchange field between it and one or more adjacent ferromagnetic layers. The resulting magnetoresistence of the device may be measured. Devices in accordance with the present invention may be utilized for MRAM read heads, memory storage cells and/or logical circuitry such as XOR or NXOR devices.

13 Claims, 5 Drawing Sheets

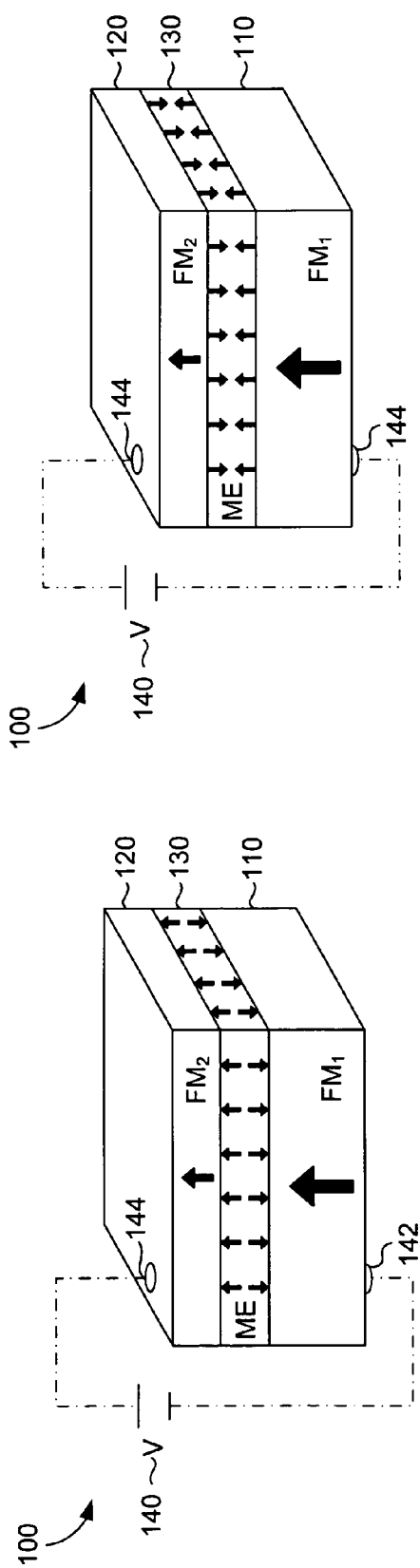
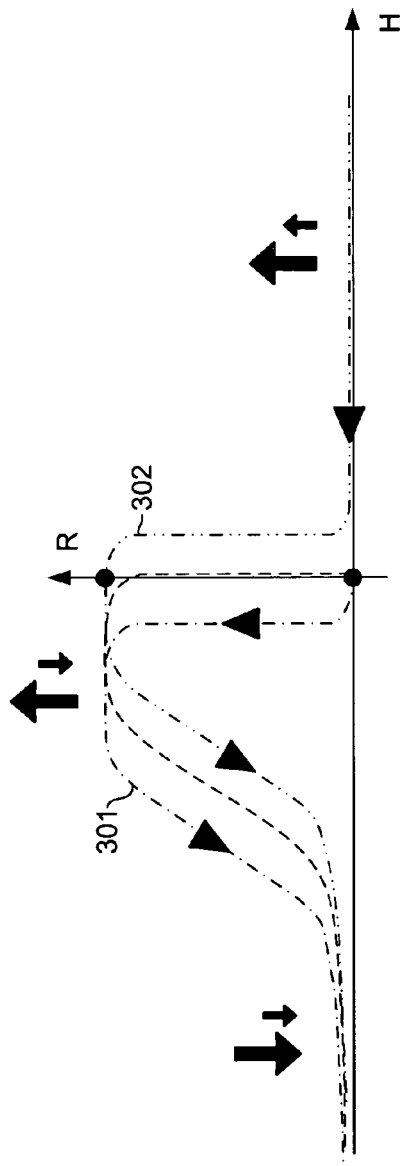
FIG. 1.
FIG. 2.
FIG. 3.

MAGNETIC SPIN VALVE WITH A MAGNETOELECTRIC ELEMENT

CROSS-REFERENCE TO RELATED APPLICATIONS

This application claims the benefit of U.S. Provisional Patent Application No. 60/686,356, filed Jun. 1, 2005 and entitled "Magnetic Spin Valve with a Magnetoelectric Element" which is hereby incorporated by reference.

STATEMENT REGARDING FEDERALLY SPONSORED RESEARCH OR DEVELOPMENT

Not applicable.

BACKGROUND

The circuitry used for computing systems has advanced at a rapid rate. Circuit elements for both logical circuitry and memory circuitry, such as magnetic random access memories (MRAM), have steadily shrunk and, in many cases, required ever decreasing amounts of power to operate. However, the ever increasing demands for yet faster processing, greater storage capacity, and lower power consumption continues to require new developments for the circuitry and circuit elements used in memory and processing circuitry.

One example of the past years' advancements in computer circuitry are read heads or field sensors that take advantage of the tunneling magnetoresistance (TMR) effect. In a typical TMR-type structure, two magnetic layers are separate by an ultra thin insulating barrier material, such as $Al_2O_3$. When driving an electric current through such a tri-layer system, the resistance of the system depends on the relative orientation of the magnetization in the two magnetic layers. The magnetic orientation of the sensor layer may rotate in accordance with the stray field created by a magnetic bit of MRAM, while the pinned magnetization of the second layer remains constant in magnitude and direction. The combination of these two layers, in turn, provide the read head functionality of the device, as the varying electrical resistance across the device will indicate whether the magnetic fields of the two layers are aligned or unaligned, which depends upon the magnetic properties of the magnetic bit being read. Similarly, the TMR effect in multi-layer structures may be used in the development and fabrication of MRAM itself. In MRAM, one bit of information may be encoded in the relative orientation of a top magnetic layer relative to a pinned bottom layer. The magnetization state of the top layer may be set via the magnetic stray-field of a writing current. The information written in this manner may subsequently be read by driving a current through the structure and, based upon the observed resistance, determining whether the magnetic orientations of the two layers are aligned or unaligned, which may correspond to either a one or a zero.

SUMMARY

The present invention improves upon structures previously using conventional TMR or giant magnetoresistance (GMR) type structures, as well as creates novel logic devices, by replacing the passive insulating barrier material, such as $Al_2O_3$, with an active magnetoelectric material, such as $Cr_2O_3$. In a magnetoelectric material, an applied electric field induces a magnetic moment. An anti-ferromagnetic magnetoelectric thin film used in this fashion may serve as a dielectric tunnel junction between two ferromagnetic metallic layers and replace the conventional passive tunneling barrier previously employed. A tunnel barrier is an ideal system for sustaining very high electric fields, such as those reaching up to one volt per nanometer. The electrically induced magnetization in the magnetoelectric barrier interacts via magnetic exchange with the two adjacent ferromagnetic layers. This creates a shift of the magnetization curves of both ferromagnetic layers proportional to the magnetization in the magnetoelectric layer, which is dependent upon the applied voltage in the device. An anti-ferromagnetic magnetoelectric thin film may also be used to pin a magnetic layer to form a device useful as a memory cell, or even as a logic device.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein:

FIG. 1 illustrates an example of a device in accordance with the present invention;

FIG. 2 further illustrates an example of a device in accordance with the present invention;

FIG. 3 illustrates the magnetoresistance properties of a device in accordance with the present invention;

DETAILED DESCRIPTION

Figure 4:
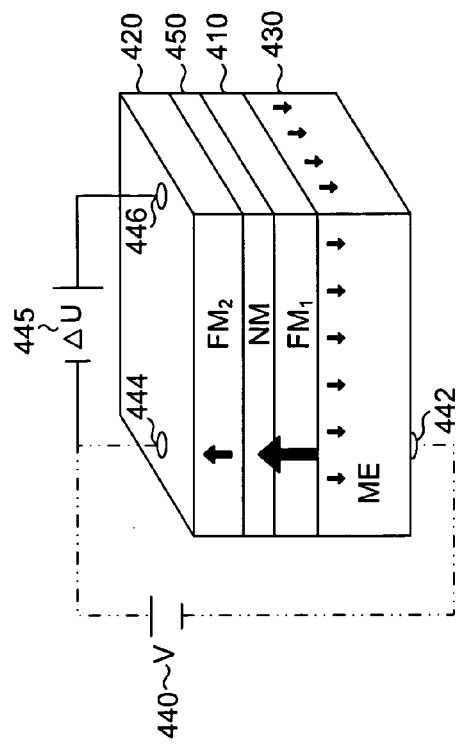
FIG. 4 illustrates a further example of a device in accordance with the present invention.

Various embodiments of the present invention utilize an anti-ferromagnetic magnetoelectric thin film material in conjunction with ferromagnetic metallic layers. An applied voltage creates an electric field in the anti-ferromagnetic magnetoelectric thin film, which induces a magnetic moment in the film. The electrically induced magnetization in the anti-ferromagnetic magnetoelectric thin film interacts via magnetic exchange with one or more adjacent ferromagnetic films, which creates a shift in the magnetization curve of adjacent ferromagnetic layers proportional to the magnetization in the anti-ferromagnetic magnetoelectric film, which depends upon the voltage applied to the device.

Referring now to FIG. 1, a device. 100 in accordance with the present invention is illustrated. Device 100 may comprise a first ferromagnetic metallic layer 110 and a second ferromagnetic metallic layer 120 separated by an anti-ferromagnetic magnetoelectric thin film junction 130. First ferromagnetic metallic layer 110 and second ferromagnetic metallic layer 120 may comprise $CrO_2$, while anti-ferromagnetic magnetoelectric thin film junction 130 may comprise $Cr_2O_3$. One skilled in the art will realize, however, that other materials with similar electrical properties may be used in conjunction with the present invention. First ferromagnetic metallic layer 110 may be a hard magnetic layer with a fixed magnetic field. Alternatively, the magnetic field in first ferromagnetic metallic layer 110 may be fixed using a pinning layer (not illustrated) adjacent to it. A voltage differential may be applied by voltage source 140 between electrical contact 142 on the first ferromagnetic metallic layer 110 and electrical contact 144 on second ferromagnetic metallic layer 120. One skilled in the art will realize that electrical contacts 142, 144 need not be positioned as illustrated and may be indirect. The magnetic orientation of second ferromagnetic metallic layer 120 may be soft, while the magnetic orientation of the anti-ferromagnetic magnetoelectric thin film junction 130 will vary depending upon the voltage applied by voltage source 140. Anti-ferromagnetic magnetoelectric thin film junction may sustain a very high electric field, reaching up to 1 V/nm for $Cr_2O_3$ and possibly higher for other materials. An exchange field may be generated having a value of the order of the saturation field of the soft magnetic second ferromagnetic metallic layer 120. This exchange field may be several mT in magnitude and provides control of the magnetization direction of the second ferromagnetic metallic layer 120. FIG. 1 illustrates the magnetic orientation of anti-ferromagnetic magnetoelectric thin film junction when a first voltage is applied by voltage source 140.

FIG. 2 illustrates device 100 when a second voltage has been applied by voltage source 140. As can be seen in FIG. 2, the orientation of magnetic field within anti-ferromagnetic magnetoelectric thin film junction 130 has changed, resulting in a changed magnetoresistance of device 100 from first contact 142 to second contact 144.

The resistance value of device 100 as a function of electric field resulting from the applied voltage differential is illustrated in FIG. 3. The resistance value of device 100 depends upon the polarity of the applied voltage from voltage source 140, which makes device 100 well suited for memory applications. Line 301 illustrates the performance of device 100 as configured in FIG. 1, while line 302 illustrates the performance of device 100 as configured in FIG. 2.

Referring now to FIG. 4, a further device 400 in accordance with the present invention is illustrated. Device 400 may comprise a first ferromagnetic metallic layer 410 and a second ferromagnetic metallic layer 420 separated by a nonmagnetic layer 450. First ferromagnetic metallic layer 410 may be pinned to an anti-ferromagnetic magnetoelectric thin film 430. First ferromagnetic metallic layer 410 and second ferromagnetic metallic layer 420 may comprise $CrO_2$ while anti-ferromagnetic magnetoelectric thin film 430 may comprise $Cr_2O_3$. One skilled in the art will realize, however, that other materials with similar electrical properties may be used in conjunction with the present invention. A magnetic field may be induced in anti-ferromagnetic magnetoelectric thin film 430 by applying a voltage differential from voltage source 440 between electrical contact 442 and electrical contact 444. One skilled in the art will realize that electrical contacts 442, 444 need not be positioned as illustrated and may be indirect. A voltage differential V controls the magnetization of anti-ferromagnetic magnetoelectric thin film 430, which tunes the exchange coupling with the pinned first ferromagnetic metallic layer 410. A maximum exchange field $M_oH_e$ exists due to coupling between first ferromagnetic metallic layer 410 and anti-ferromagnetic magnetoelectric thin film 430, which allows switching of the field value of first ferromagnetic metallic layer 410 between— $M_oH_e-M_oH_i$ and $M_oH_e-M_oH_i$ for the half-hysteresis state after reaching a positive saturation field, where $M_oH_i$ is the small intrinsic switching field of the free first ferromagnetic metallic layer 410. The exchange field $M_oH_e$ may have a magnitude corresponding to typical pinning values of spin valve devices, which can be several tens of mT. FIG. 4 illustrates device 400 at a first voltage applied by voltage source 440 such that the magnetic field within first ferromagnetic metallic layer 410 is illustrated.

Figure 5:
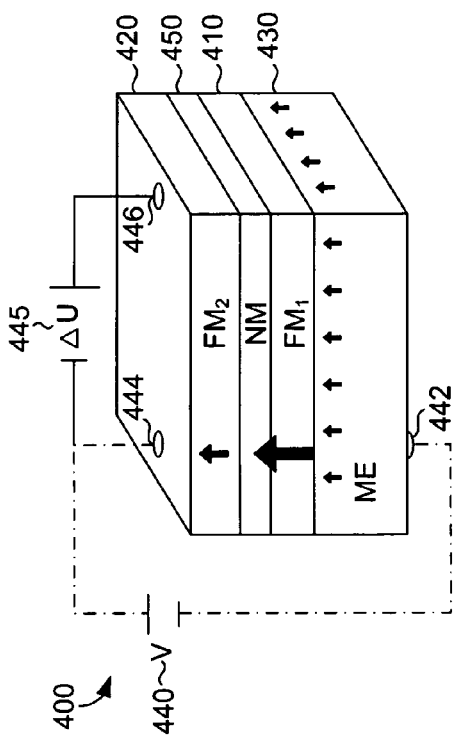
FIG. 5 further illustrates a further example of a device in accordance with the present invention.

FIG. 5 illustrates device 400 with a second voltage applied by voltage source 440 to induce a second magnetic field in anti-ferromagnetic magnetoelectric thin film junction 430. As illustrated in FIG. 4 and FIG. 5, the magnetoresistivity of device 400 may be measured between second electrical contact 444 and a third electrical contact 446, positioned so as to measure the resistance of device 400 along a nonlateral direction of device 400. Intrinsic longitudinal properties of anti-ferromagnetic magnetoelectric thin film 430 makes a non-lateral characterization of the magnetoresistance of device 400 desirable. One skilled in the art will appreciate that electrical contacts 444, 446 could be positioned differently than illustrated and may be indirect. One skilled in the art will further realize that a fourth contact (not shown) could be used instead of second contact 444 to measure the magnetoresistance of device 400.

Figure 6:
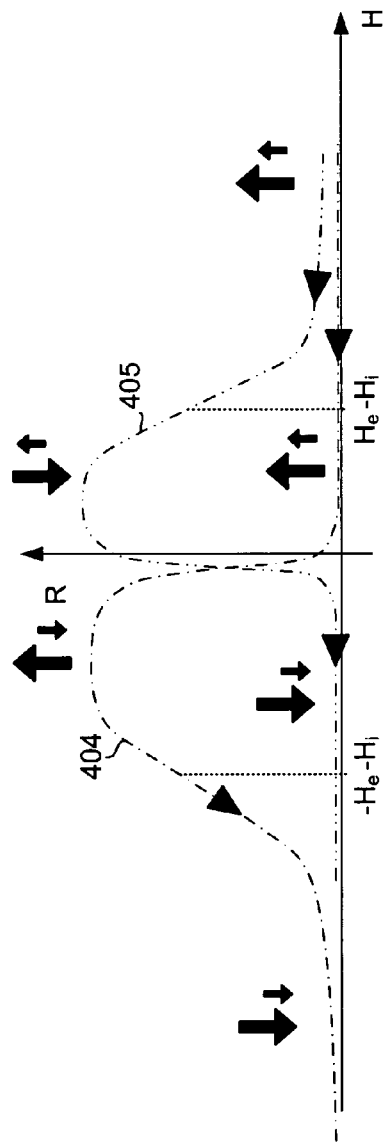
FIG. 6 illustrates the magnetoresistance properties of a further device in accordance with the present invention.

The resulting magnetoresistance curves of device 400 are illustrated in FIG. 6. Line 404 illustrates performance of device as configured in FIG. 4, while line 405 illustrates performance of device as configured in FIG. 5. Devices such as device 400 illustrated in FIG. 4 and FIG. 5 may be particularly useful as a mechanism for current induced switching in magnetic memories. Further, device 400 may be used as a logic device, with the voltage applied by voltage source 440 serving as one logical input and the direction of an external magnetic field serving as a second logical input, and with the resulting high or low resistance serving as the logical output. Logical XOR and NXOR gates could be fabricated in this fashion.

Figure 7:
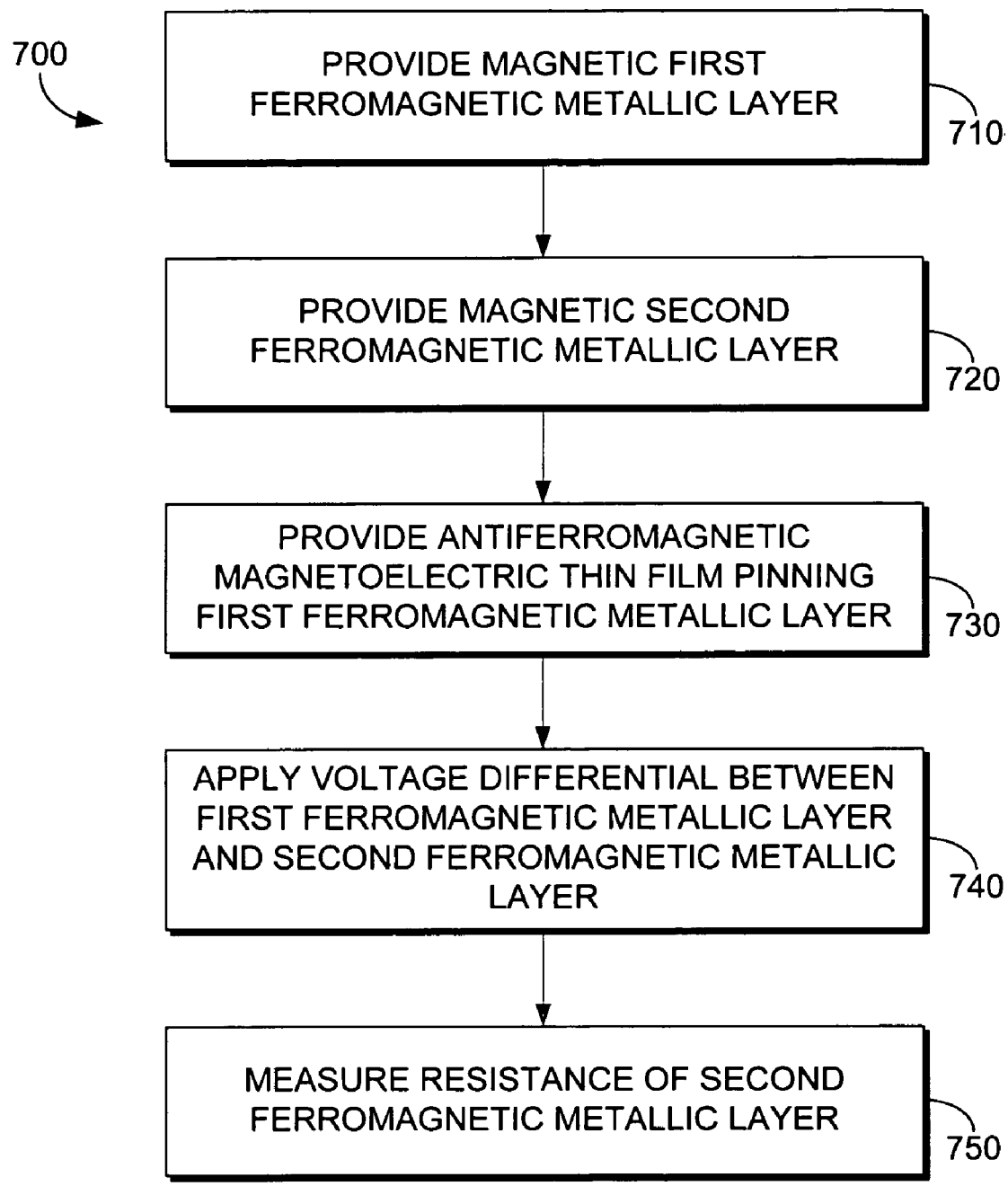
FIG. 7 illustrates a method in accordance with the present invention.

Referring now to FIG. 7, a method 700 of utilizing a device such as device 100 is illustrated. Method 700 begins by providing a hard magnetic first ferromagnetic metallic layer in step 710. Step 700 further includes the step of providing a soft magnetic second ferromagnetic metallic layer as step 720. Method 700 further provides an anti-ferromagnetic magnetoelectric thin film junction between the first and second ferromagnetic metallic layers in step 730. A voltage differential is applied between the first ferromagnetic metallic layer and the second ferromagnetic metallic layer in step 740. As a result of step 740, a magnetic field is induced in the anti-ferromagnetic magnetoelectric thin film junction, leading to varying magnetoresistance of the device 100 that can indicate whether a stray-field (for example, from a bit of MRAM) is present. The magnetoresistance of device 100 may be measured in step 750.

Figure 8:
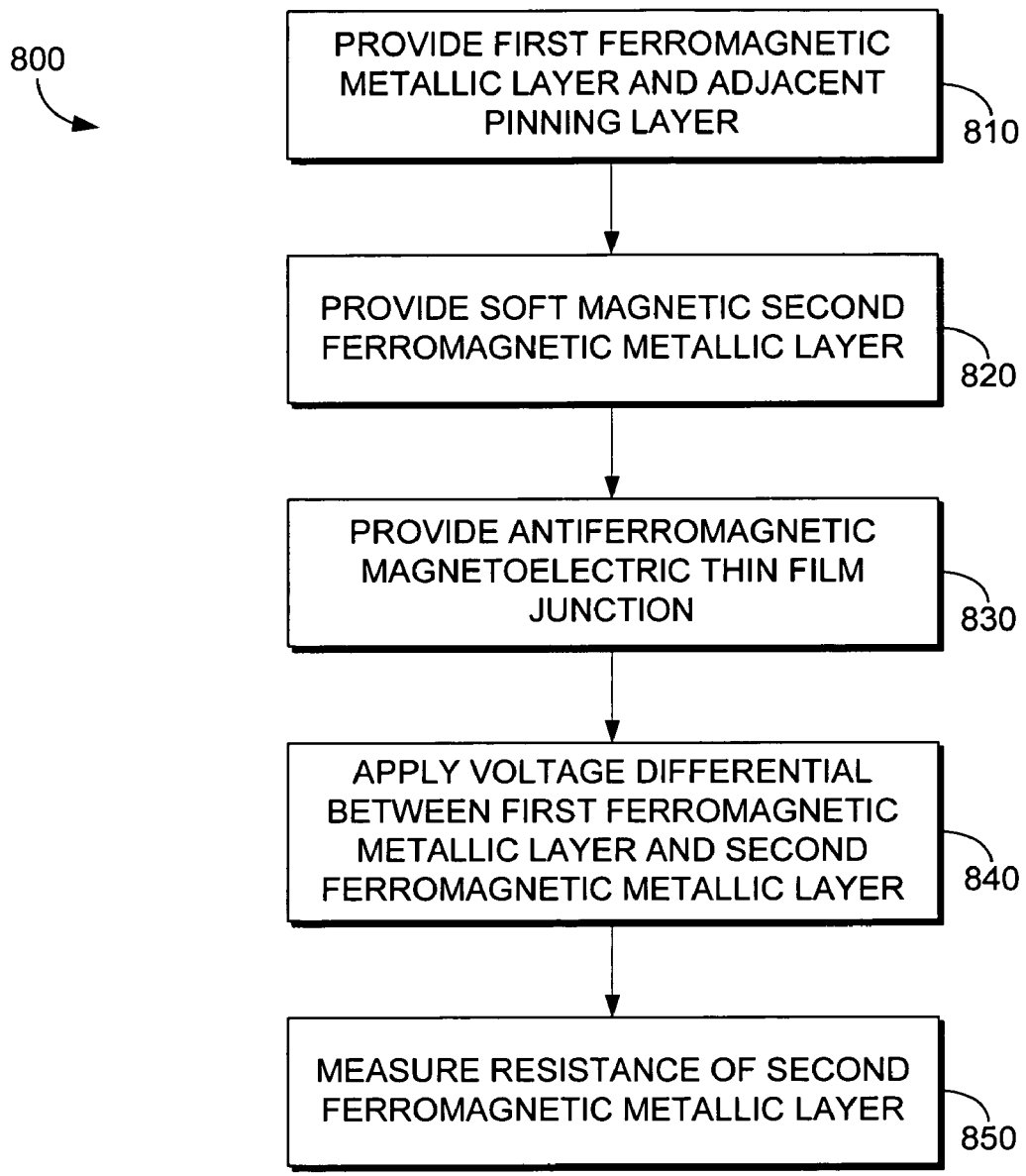
FIG. 8 illustrates a method in accordance with the present invention.

A further method 800 in accordance with the present invention of utilizing a device such as device 100 is illustrated in FIG. 8. In method 800 a first ferromagnetic metallic layer and an adjacent pinning layer are provided in step 810. Method 800 thereafter continues in a fashion similar to method 700, with the step of providing a soft magnetic second ferromagnetic layer 820 corresponding to step 720; the step of providing a anti-ferromagnetic magnetoelectric thin film junction in step 830 corresponding to step 730; the application of a voltage differential of step 840 corresponding to step 740; and the measurement of the magnetoresistance of the device in step 850 corresponding to step 750.

Figure 9:
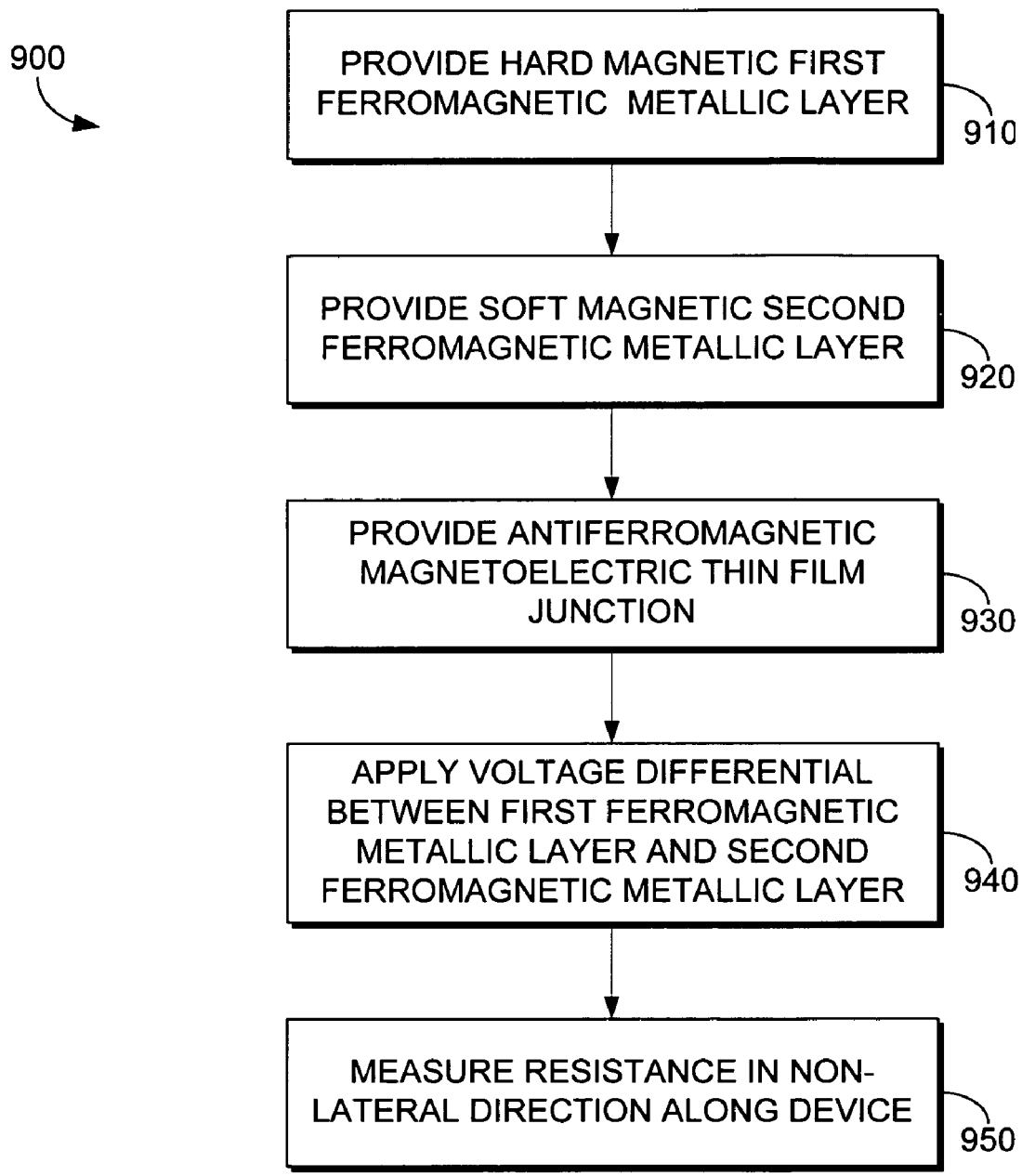
FIG. 9 illustrates a method in accordance with the present invention.

Referring now to FIG. 9, a further method 900 in accordance with the present invention is illustrated. A first ferromagnetic metallic layer is provided in step 910. A magnetic second ferromagnetic layer is provided in step 920. An anti-ferromagnetic magnetoelectric thin film is pinned to the first ferromagnetic metallic layer in step 930. A voltage differential is applied to the device in step 940. The nonlateral magnetoresistance properties of the device are measured in step 950. The nonlateral magnetoresistance properties measured in step 950 may be used for various purposes, such as described in conjunction with FIGS. 4-6.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A device comprising:
a first ferromagnetic metallic layer;
a second ferromagnetic metallic layer;
an anti-ferromagnetic magnetoelectric thin film junction between the first ferromagnetic metallic layer and the second ferromagnetic metallic layer; and
a voltage source connected to the first ferromagnetic metallic layer and the second ferromagnetic metallic layer so as to apply a voltage differential between the first ferromagnetic layer and the second ferromagnetic layer; and wherein:
the anti-ferromagnetic thin film junction functions as a dielectric tunnel junction between the first ferromagnetic metallic layer and the second ferromagnetic metallic layer in response to a voltage differential applied by the voltage source.

2. The device of claim 1, further comprising:
a pinning layer adjacent to the first ferromagnetic layer opposite the anti-ferromagnetic magnetoelectric thin film junction, the pinning layer fixing the magnetic field of the first ferromagnetic layer.

3. The device of claim 1, wherein:
the second ferromagnetic layer comprises a soft magnetic layer; and
the first ferromagnetic layer comprises a hard magnetic layer.

4. The device of claim 1, further comprising:
a pinning layer adjacent to the first ferromagnetic layer opposite the anti-ferromagnetic magnetoelectric thin film junction, the pinning layer fixing the magnetic field of the first ferromagnetic layer; and wherein:
the second ferromagnetic layer comprises a soft magnetic layer.

5. The device of claim 1, wherein:
the anti-ferromagnetic magnetoelectric thin film junction comprises $Cr_2O_3$.

6. The device of claim 5, wherein:
the first ferromagnetic metallic layer comprises $CrO_2$; and
the second ferromagnetic metallic layer comprises $CrO_2$.

7. A device comprising;
a first ferromagnetic metallic layer;
a second ferromagnetic metallic layer;
an anti-ferromagnetic magnetoelectric thin film layer adjacent to the first ferromagnetic metallic layer, an exchange coupling existing between the anti-ferromagnetic magnetoelectric thin film and the first ferromagnetic metallic layer; and
a voltage source connected to the first ferromagnetic metallic layer and the second ferromagnetic metallic layer so as to apply a voltage differential between the second ferromagnetic layer and the anti-ferromagnetic magnetoelectric thin film layer; and wherein:
the voltage differential applied by the voltage source controls the magnetization of the anti-ferromagnetic thin film layer, which in turn tunes the exchange coupling between the anti-ferromagnetic magnetoelectric thin film layer and the first ferromagnetic metallic layer.

8. The device of claim 7, further comprising:
a pinning layer adjacent to the first ferromagnetic layer opposite the anti-ferromagnetic magnetoelectric thin film junction, the pinning layer fixing the magnetic field of the first ferromagnetic layer.

9. The device of the claim 7, wherein:
the second ferromagnetic layer comprises a soft magnetic layer; and
the first ferromagnetic layer comprises a hard magnetic layer.

10. The device of claim 7, wherein:
the anti-ferromagnetic magnetoelectric thin film layer comprises $Cr_2O_3$.

11. The device of claim 10, wherein:
the first ferromagnetic metallic layer comprises $CrO_2$; and
the second ferromagnetic metallic layer comprises $CrO_2$.

12. The device of claim 7, wherein:
the first ferromagnetic metallic layer, and the anti-ferromagnetic magnetoelectric thin film layer are oriented in a substantially parallel fashion, thereby defining a lateral direction substantially perpendicular to the orientation of the first ferromagnetic metallic layer, the second ferromagnetic metallic layer, and the anti-ferromagnetic magnetoelectric thin film layer.

13. The device of claim 12, further comprising:
at least two electrical connections that permit the measurement of the magnetoresistance of the device along a non-lateral direction.

* * * * *

UNITED STATES PATENT AND TRADEMARK OFFICE
CERTIFICATE OF CORRECTION

PATENT NO. : 7,358,846 B2  Page 1 of 1
APPLICATION NO. : 11/444675
DATED : April 15, 2008
INVENTOR(S) : Bernard Doudin It is certified that error appears in the above-identified patent and that said Letters Patent is hereby corrected as shown below:

Column 1 at line 5 insert the following phrase, --This invention was made with government support under NSF DMR0213808 awarded by the National Science Foundation. The government has certain rights in the invention.--

Signed and Sealed this

Ninth Day of June, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 7,358,846 B2 |
| APPLICATION NO. | : 11/444675 |
| DATED | : April 15, 2008 |
| INVENTOR(S) | : Bernard Doudin and Christian Binek |

It is certified that error appears in the above-identified patent and that said Letters Patent is hereby corrected as shown below:

On the title page, Column 1 (Inventor), after "68512" please add -- ; Christian Binek, Holmes Park Road, Lincoln, NE (US) 68506 --

Signed and Sealed this
Twelfth Day of April, 2016

Michelle K. Lee
*Director of the United States Patent and Trademark Office*